United States Patent
Huang et al.

(10) Patent No.: US 6,221,712 B1
(45) Date of Patent: Apr. 24, 2001

(54) METHOD FOR FABRICATING GATE OXIDE LAYER

(75) Inventors: Kuo-Tai Huang, Hsinchu; Michael W C Huang; Tri-Rung Yew, both of Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/385,805

(22) Filed: Aug. 30, 1999

(51) Int. Cl.$^7$ ................................................ B32B 19/00
(52) U.S. Cl. ..................... 438/240; 438/216; 438/396; 438/591; 438/785
(58) Field of Search .................... 438/216, 240, 438/287, 591, 785, 396

(56) References Cited

U.S. PATENT DOCUMENTS

| | | | |
|---|---|---|---|
| 4,416,933 | * 11/1983 | Antson | 428/216 |
| 4,734,340 | * 3/1988 | Saito | 428/698 |
| 5,834,353 | * 11/1998 | Wu | 438/287 |
| 5,908,312 | * 6/1999 | Cheung | 438/287 |
| 5,918,147 | * 6/1999 | Filipiak | 438/636 |
| 5,923,983 | * 7/1999 | Fulford | 438/287 |
| 5,963,810 | * 10/1999 | Gardner | 438/287 |
| 6,020,024 | * 2/2000 | Maiti | 427/248.1 |
| 6,037,205 | * 3/2000 | Huh | 438/240 |
| 6,037,235 | * 3/2000 | Narwankar | 438/396 |

FOREIGN PATENT DOCUMENTS

| | | |
|---|---|---|
| 02067753 | * 3/1990 | (JP) . |
| 04056270 | * 2/1992 | (JP) . |
| 11074478 | * 3/1999 | (JP) . |

OTHER PUBLICATIONS

Wolf, Stanely, vol. 1, Silicon Processing for the VLSI Era, pp438–41, 1986.*
Wolf, Stanely, vol. 2, Silicon Processing for the VLSI Era, pp144–45, 1990.*

* cited by examiner

Primary Examiner—Charles Bowers
Assistant Examiner—Lisa Kilday
(74) Attorney, Agent, or Firm—Thomas, Kayden, Horstemeyer & Risley

(57) ABSTRACT

A method for fabricating a gate structure. The method involves providing a substrate, followed by forming a nitride region on a surface of the substrate. With a Tantalum (Ta)-based organic compound and a Titanium (Ti)-based organic compound serving as precursors, an organic metal chemical vapor deposition (OMCVD) is performed, so that a $Ta_{2-x}Ti_xO_5$ dielectric layer is formed on the substrate. A barrier layer, a conducting layer, and an anti-reflection (AR) layer are then formed in sequence on the $Ta_{2-x}Ti_xO_5$ dielectric layer. Subsequently, the AR layer, the conducting layer, the barrier layer, and the $Ta_{2-x}Ti_xO_5$ dielectric layer are defined to form a gate structure on the substrate of the nitride region. The Ta-based organic compound in this case may include a Ta-alkoxide compound, whereas the Ti-based organic compound may include a Ti-alkoxide compound or a Ti-amide compound.

27 Claims, 3 Drawing Sheets

METHOD FOR FABRICATING GATE OXIDE LAYER

BACKGROUND OF THE INVENTION

1. Field of Invention

The present invention relates to a method for fabricating an integrated circuit (IC). More particularly, the present invention relates to a method for fabricating a gate oxide layer.

2. Description of Related Art

Currently, in the semiconductor process, the integration of the IC has become higher as the size of the field effect transistor (FET) becomes smaller. When the size of FET is smaller than 0.1 μm, the thickness of the gate oxide layer is smaller than 20 Å. However, the gate oxide layer is made from 6~7 layers of $SiO_2$ molecules equivalent to a thickness of about 20 Å. So, electrons may tunnel through the gate $SiO_2$ layer and cause leakage. Since the gate $SiO_2$ layer is thinner, it may be tunneled through by the dopant ions. Thus, this causes electrical problems for the device. As the size of the FET is usually limited by the thickness of the gate $SiO_2$ layer, many dielectrics having high dielectric constants are currently being developed to solve the problems introduced by the gate $SiO_2$ layer mentioned above. These dielectrics include $Ta_2O_5$, $Pb(Zr, Ti)O_3$ (i.e. PZT), and $(Ba, Sr)TiO_3$ (i.e. BST), wherein $Ta_2O_5$ has a dielectric constant of about 20–25, the BST has a dielectric constant of about 20–60, and the PZT has a dielectric constant of about 600–1000.

Among the three types of dielectrics mentioned above, the process for $Ta_2O_5$ is most compatible with the current process. As $Ta_2O_5$ has to undergo recrystallization after its formation, in order to purify and strengthen its structure, the oxygen employed during the recrystallization may oxidize the silicon substrate to form a $SiO_2$ layer between the silicon substrate and the $Ta_2O_5$ layer. Since the $SiO_2$ layer has a lower dielectric constant, the $Ta_2O_5$ layer formed by the conventional method is only able to obtain a dielectric constant of about 15, instead of a basic value of 25. Thus, the $Ta_2O_5$ layer formed by the conventional method cannot satisfy the need for further integration in future devices, and substitute dielectrics, such as BST and PZT which have high dielectric constants, should be used.

However, when BST and PZT are used as dielectric layers, current leakage problems may easily occur since these dielectrics have exceedingly high dielectric constants. So, many considerations have to be made for such processes. The compatibility problem of the whole process may also be encountered with BST and PZT serving as dielectric layers. Therefore, it is not easy to integrate the method mentioned above with the current process.

SUMMARY OF THE INVENTION

The invention provides a method for fabricating a gate dielectric layer. The method involves performing an organic metal chemical vapor deposition (OMCVD), with a Ta-based organic compound and a Ti-based organic compound serving as precursors, so that a $Ta_{2-x}Ti_xO_5$ dielectric layer is formed.

As embodied and broadly described herein, the invention provides a method for fabricating a gate structure. A substrate is provided, followed by forming a nitride region on a surface of the substrate. With a Tantalum (Ta)-based organic compound and a Titanium (Ti)-based organic compound serving as precursors, an organic metal chemical vapor deposition (OMCVD) is performed to form a $Ta_{2-x}Ti_xO_5$ dielectric layer on the substrate. A barrier layer, a conducting layer, and an anti-reflection layer are formed in sequence on the $Ta_{2-x}Ti_xO_5$ dielectric layer. Consequently, the anti-reflection layer, the conducting layer, the barrier layer, and the $Ta_{2-x}Ti_xO_5$ dielectric layer are patterned to form a gate structure on the substrate of the nitride region. The Ta-based organic compound may include a Ta alkoxide compound, whereas the Ti-based organic compound may include a Titanium alkoxide compound or a Titanium amino compound.

As the $Ta_{2-x}Ti_xO_5$ dielectric layer is formed by OMCVD, it has not only a higher dielectric constant but also better reliability. Furthermore, a stable and uniform phase without any phase transfer is maintained at the temperature involved in the subsequent process for the semiconductor device without any phase transfer. Thus, both the. property and the reliability of the device are maintained. In addition, the fabrication method of the $Ta_{2-x}Ti_xO_5$ dielectric layer is compatible with the conventional method for fabricating the $Ta_2O_5$ dielectric layer, so that process integration is easily achievable with the method of the invention. As the $Ta_{2-x}Ti_xO_5$ dielectric layer is much thicker, the conventional problems such as the tunneling gate leakage and the penetration of the dopant ions, due to the thickness limitation of the gate $SiO_2$ layer, are solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
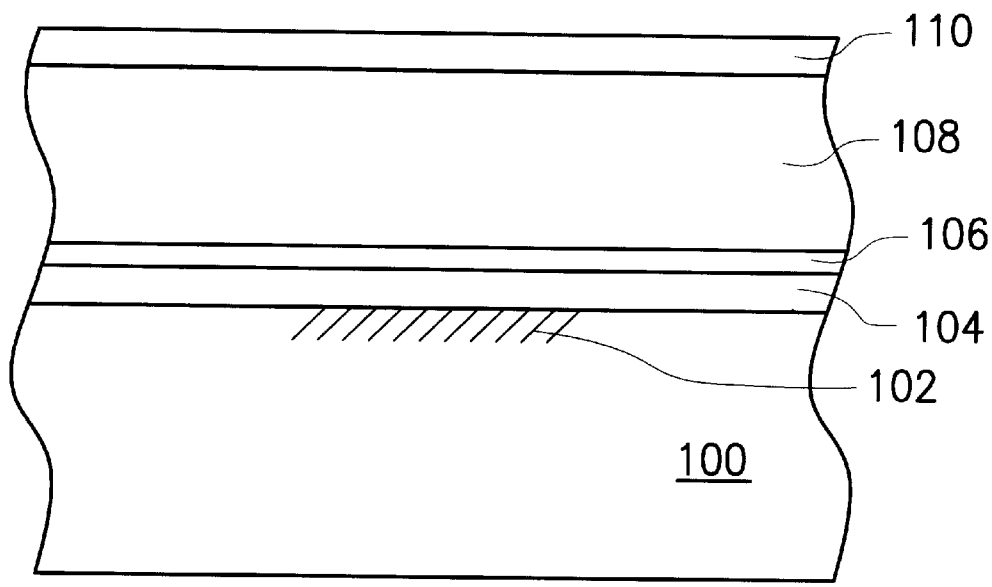
FIGS. 1A to 1C are schematic diagrams illustrating the process flow for fabricating a FET according to one preferred embodiment of this invention.
Figure 1B:
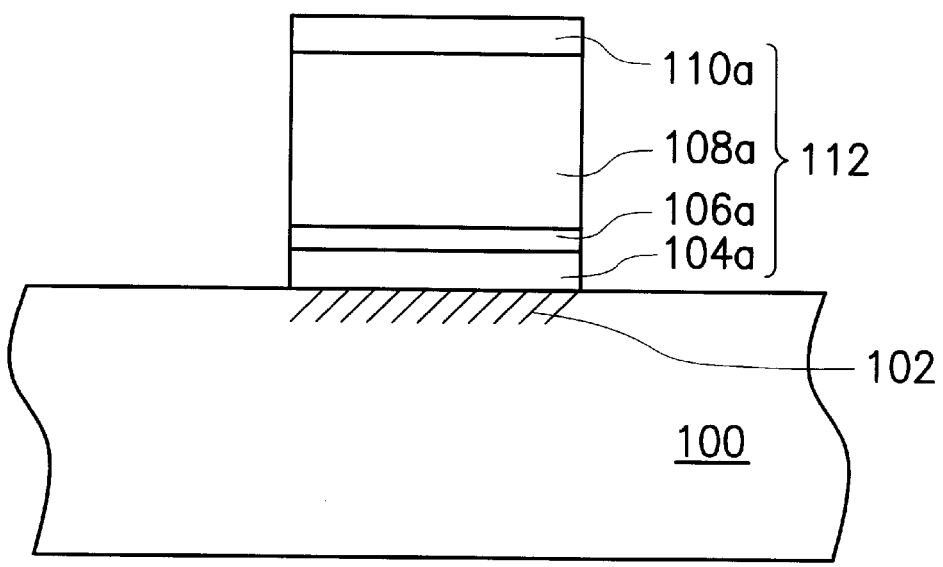
Figure 1C:
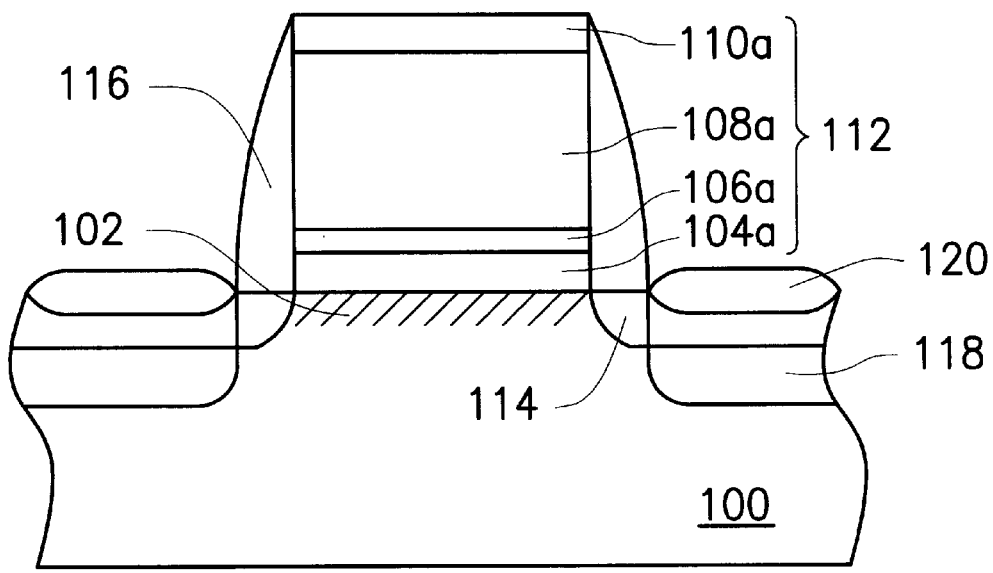

Reference is made to FIGS. 1A to 1C, which illustrates the process flow for fabricating a FET according to one preferred embodiment of this invention.

Referring to FIG. 1A, a substrate 100 such as a semiconductor silicon substrate is provided. A patterned photoresist (not shown) is formed on the substrate 100, wherein the patterned photoresist partially exposes a surface of the substrate 100 for preforming a gate structure. A nitridation process is then performed to nitridate the exposed surface of the substrate 100 such that a nitride region 102 is formed. Such nitridation process involves performing a rapid thermal nitridation (RTN) for 30–60 seconds, under conditions where the temperature is about 800–900° C., and the surrounding environment is filled with ammonia gas. As a result, the silicon atoms on the exposed surface of the substrate 100 are nitridated into the silicon nitride or silicon oxy-nitride in the nitride region 102, wherein the nitride region 102 has a depth of about 10–15 Å.

The patterned photoresist is removed, followed by forming a $Ta_{2-x}Ti_xO_5$ dielectric layer 104 on the substrate 100.

Figure 2:
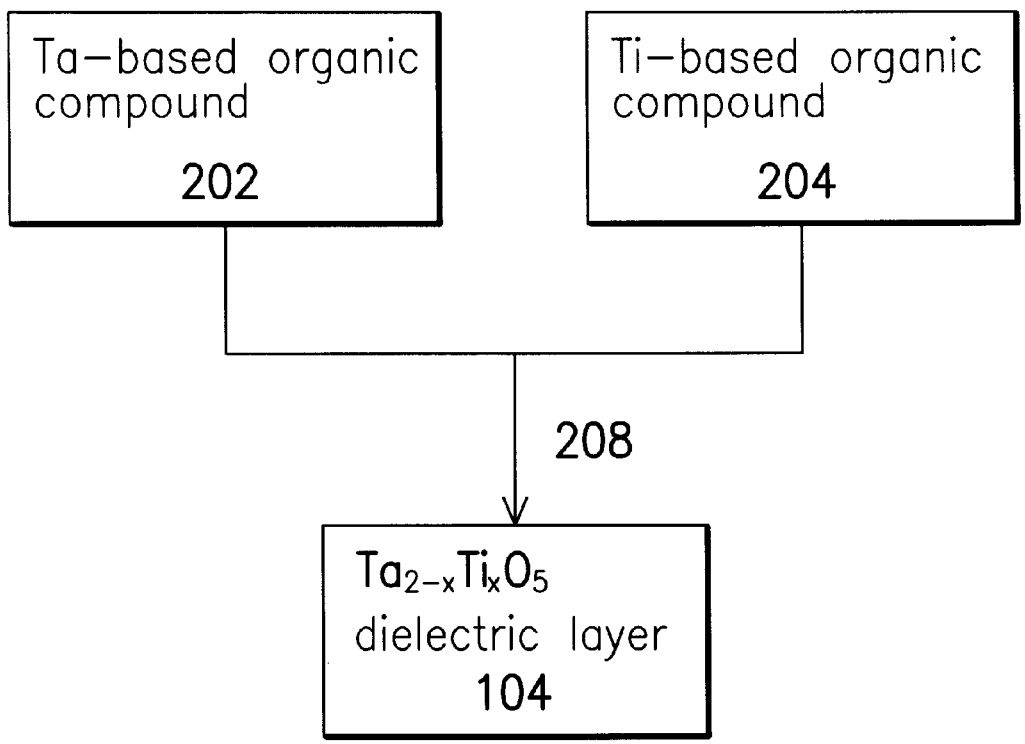
FIG. 2 is a flow chart for the process forming the $Ta_{2-x}Ti_xO_5$ dielectric layer.

Reference to the formation of the $Ta_{2-x}Ti_xO_5$ dielectric layer 104 is made in FIG. 2, which illustrates the process flow for forming the $Ta_{2-x}Ti_xO_5$ dielectric layer 104. The formation of the $Ta_{2-x}Ti_xO_5$ dielectric layer 104 involves providing a Ta-based organic compound 202 and a Ti-based organic compound 204. An organic metal chemical vapor deposition (OMCVD) is then performed, with the Ta-based organic compound 202 and the Ti-based organic compound 204 serving as precursors, so that the $Ta_{2-x}Ti_xO_5$ dielectric layer 104 (refer to FIG. 1A) with a stable and uniform phase is formed on the substrate 100. Preferably, the deposition temperature is about 380–500° C.

The Ta-based organic compound 202 may include a Ta alkoxide compound, such as Tantalum penta-ethoxide (Ta$(C_2H_5O)_5$), Tantalum tetraethoxy dimethylaminoethoxide (Ta$(C_2H_5O)_4(C_4H_{10}NO)$), Tantalum tetraethoxy tetramethylheptanedionate (Ta$(C_2H_5O)_4(C_{11}H_{19}O_2)$), Tantalum tetramethoxy tetramethylheptanedionate (Ta$(CH_3O)_4$ $(C_{11}H_{19}O_2)$), Tantalum tetra-i-propoxy tetramethylheptanedionate (Ta$(C_3H_7O)_4(C_{11}H_{19}O_2)$), or Tantalum tris-diethylamino-t-butylimide ($((C_4H_{10}N)_3Ta$ $(NC_4H_9))$. Preferably, the compound includes Ta$(C_2H_5O)_5$ and Ta$(C_2H_5O)_4(C_4H_{10}NO)$.

The Ti-based organic compound 204 may include a Titanium alkoxide compound or a Titanium amino compound. The Titanium alkoxide compound is Titanium tetra-i-propoxide (Ti$(C_3H_7O)_4$), Titanium di-i-propoxide (Ti $(C_3H_7O)_2$), Titanium di-i-propoxy bidimethylaminoethoxide (Ti$(C_3H_7O)_2(C_4H_{10}NO)_2$), Titanium diethoxy bidimethylaminoethoxide (Ti$(C_2H_5O)_2$ $(C_4H_{10}NO)_2$), or Titanium tetrakis-t-butoxide (Ti$(C_4H_9O)_4$). In contrast, the Titanium amino compound is selected from a group consisting of Titanium tetrakis-diethylamide (Ti $(C_4H_{10}N)_4$) and Titanium tetrakis-dimethylamide (Ti $(C_2H_6N)_4$).

The Ta-based organic compound 202 and the Ti-based organic compound can be premixed before deposition. Alternatively, the Ta-based organic compound 202 and the Ti-based organic compound 204 can be respectively conveyed by pipes and mixed in situ before performing OMCVD in step 208.

The dielectric constants of the $Ta_{2-x}Ti_xO_5$ dielectric layer 104 are determined by the Ta and Ti contents in the $Ta_{2-x}Ti_xO_5$ dielectric layer 104. Hence, the dielectric constants of the $Ta_{2-x}Ti_xO_5$ dielectric layer 104 can be adjusted by controlling the molar percentage between the Ta-based organic compound and the Ti-based organic compound. Preferably, the $Ta_{2-x}Ti_xO_5$ dielectric layer 104 has a Ti content of about 4–15% of the molar percentage based on the total content of Ta and Ti (i.e. the x in $Ta_{2-x}Ti_xO_5$ is about 0.08–0.3), while it has a dielectric constant of about 38–44.

Since the $Ta_{2-x}Ti_xO_5$ dielectric layer 104 is formed by OMCVD, the formed $Ta_{2-x}Ti_xO_5$ dielectric layer has a better reliability, while a stable and uniform phase is maintained at a temperature involved in the subsequent process for the semiconductor device, without any phase change. Therefore, the dielectric constant of the $Ta_{2-x}Ti_xO_5$ dielectric layer in the present invention is held constant to maintain both the reliability and the property of the device.

A barrier layer 106, a conducting layer 108, and an anti-reflection layer 110 are formed in sequence on the substrate after the formation of the $Ta_{2-x}Ti_xO_5$ dielectric layer 104. The barrier layer 106 serves to protect the $Ta_{2-x}Ti_xO_5$ dielectric layer 104 from interacting with the conducting material during the subsequent formation of the conducting layer 108. The barrier layer 106 has a better etching selectivity than the $Ta_{2-x}Ti_xO_5$ dielectric layer 104, while the barrier layer 106 includes a Titanium nitride (TiN) layer, a Tantalum nitride (TaN) layer, or a Tungsten nitride (WN) layer formed to a thickness of about 500–2000 Å by sputtering. The anti-reflection layer 110 may include a silicon nitride layer formed by CVD.

Referring to FIG. 1B, the anti-reflection layer 110, the conducting layer 108, the barrier layer 106, and the $Ta_{2-x}Ti_xO_5$ dielectric layer 104 are patterned, so that a gate structure 112 having the $Ta_{2-x}Ti_xO_5$ dielectric layer 104a, the barrier layer 106a, the gate electrode 108a, and the anti-reflection layer 110a is formed on the substrate 100 of the nitride region 102. Because the $Ta_{2-x}Ti_xO_5$ dielectric layer 104a is much thicker than in the prior art, the conventional problems such as the tunneling gate leakage and the penetration of dopant ions, due to the thickness limitation of the gate $SiO_2$ layer, are solved. Furthermore, the barrier layer 106 has a better etching selectivity than the $Ta_{2-x}Ti_xO_5$ dielectric layer 104. Therefore, the etch process window is largely increased.

Referring to FIG. 1C, a lightly doped drain (LDD) region 114 is formed in the substrate 100, with the gate structure 112 serving as a mask. A spacer 116 is formed on a sidewall of the gate structure 112. The method for forming the spacer 116 involves forming a silicon oxide layer (not shown) on the substrate 100, with TEOS as a gas source. An anisotropic etching is performed to form the spacer 116 on the sidewall of the gate structure 112. A source/drain (S/D) region 118 which merges with a part of the LDD region 114 is then formed in the substrate 100, with the gate structure 112 and the spacer 116 both serving as etching masks.

A self-aligned silicide 120 is formed on a surface of the substrate 100 in the S/D region 118 to complete the manufacture of the field effect transistor (FET). The method for forming the self-aligned silicide 120 involves forming a heat resistant metal layer, such as a Ti layer, a W layer, a Co layer, a Ni layer, a Pt layer, or a Pd layer, by spluttering on the substrate 100. A thermal process step is performed to allow nitridation that occurs at the interface between the heat resistant metal layer and the S/D region 118 to form the self aligned silicide 120. The thermal process step may be performed at about 750–800° C. The remaining heat resistant metal layer that is not transformed into the silicide may be removed by wet etching.

As the process in the present invention is compatible with the conventional process, which uses $Ta_2O_5$ as the dielectric layer, the process integration is easily achievable with the method of the present invention.

Summarizing above, the invention provides several advantages as followed. First of all, the $Ta_{2-x}Ti_xO_5$ dielectric layer in the present invention has a higher dielectric constant of about 38–44. The $Ta_{2-x}Ti_xO_5$ dielectric layer in this case is formed by OMCVD, so that the formed $Ta_{2-x}Ti_xO_5$ dielectric layer has a better reliability and maintains a stable and uniform phase at the temperature involved in the subsequent process for the semiconductor device, without any phase change. Therefore, the dielectric constant of the $Ta_{2-x}Ti_xO_5$ dielectric layer in the present invention is held constant to maintain both the property and the reliability of the device. As the process in the present invention is compatible with the conventional process, which uses $Ta_2O_5$ as the dielectric layer, the process integration is easily achievable with the method of the present invention. Because the $Ta_{2-x}Ti_xO_5$ dielectric layer 104a is much thicker, the conventional problems such as the gate tunneling leakage and the penetration of the dopant ions, due to the thickness limitation of the gate $SiO_2$ layer, are solved. Furthermore, as the barrier layer located above the $Ta_{2-x}Ti_xO_5$ dielectric layer has a better etching selectivity than the $Ta_{2-x}Ti_xO_5$ dielectric layer, the etch process window is largely increased.

Although the manufacture of a FET gate dielectric layer is used as an example in the preferred embodiment in the present invention, the invention is also applicable to the process of an embedded DRAM.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate structure, the method comprising:

providing a substrate;

performing a nitridation process to nitridate a portion of the substrate to form a nitride region;

performing an organic metal chemical vapor deposition (OMCVD), with a Tantalum (Ta)-based organic compound and a Titanium (Ti)-based organic compound serving as precursors, to form a $Ta_{2-x}Ti_xO_5$ dielectric layer, which is used as a gate oxide layer, which covers the nitride region;

forming a barrier layer on the $Ta_{2-x}Ti_xO_5$ dielectric layer;

forming a conducting layer on the barrier layer;

forming an anti-reflection layer on the conducting layer; and patterning the anti-reflection layer, the conducting layer, the barrier layer, and the $Ta_{2-x}Ti_xO_5$ dielectric layer, so that a gate structure is formed on the nitride region.

2. The fabrication method of claim 1, wherein the Ta-based organic compound includes a Tantalum-alkoxide compound.

3. The fabrication method of claim 2, wherein the Ta-based organic compound is selected from a group consisting of Tantalum penta-ethoxide ($Ta(C_2H_5O)_5$), Tantalum tetraethoxy dimethylaminoethoxide ($Ta(C_2H_5O)_4$ ($C_4H_{10}NO$)), Tantalum tetraethoxy tetramethylheptanedionate ($Ta(C_2H_5O)_4(C_{11}H_{19}O_2)$), Tantalum tetramethoxy tetrarethylheptanedionate ($Ta(CH_3O)_4(C_{11}H_{19}O_2)$), Tantalum tetra-i-propoxy tetramethylheptanedionate ($Ta(C_3H_7O)_4$ ($C_{11}H_{19}O_2$)), and Tantalum tris-diethylamino-t-butylimide (($C_4H_{10}N)_3Ta(NC_4H_9)$).

4. The fabrication method of claim 1, wherein the Ti-based organic compound includes a Titanium-alkoxide compound.

5. The fabrication method of claim 4, wherein the Ti-based organic compound is selected from a group consisting of Titanium tetra-i-propoxide ($Ti(C_3H_7O)_4$), Titanium di-i-propoxide ($Ti(C_3H_7O)_2$), Titanium di-i-propoxy bidimehtylaminoethoxide ($Ti(C_3H_7O)_2(C_4H_{10}NO)_2$), Titanium diethoxy bidimehtylaminoethoxide ($Ti(C_2H_5O)_2$ ($C_4H_{10}NO)_2$), and Titanium tetrakis-t-butoxide ($Ti(C_4H_9O)_4$).

6. The fabrication method of claim 1, wherein the Ti-based organic compound includes a Titanium amino compound.

7. The fabrication method of claim 6, wherein the Ti-based organic compound is selected from a group consisting of Titanium tetrakis-diethylamide ($Ti(C_4H_{10}N)_4$) and Titanium tetrakis-dimethylaride ($Ti(C_2H_6N)_4$).

8. The fabrication method of claim 1, wherein the temperature involved in the OMCVD is about 380–500° C.

9. The fabrication method of claim 1, wherein the $Ta_{2-x}Ti_xO_5$ dielectric layer has a Ti content of about 4–15% of the molar percentage based on the total content of Ta and Ti therein.

10. A method for fabricating a field effect transistor (FET), the method comprising:

providing a substrate;

performing a nitridation process to nitridate a portion of the substrate to form a nitride region;

performing an organic metal chemical vapor deposition (OMCVD), with a Tantalum (Ta)-based organic compound and a Titanium (Ti)-based organic compound serving as precursors, to form a $Ta_{2-x}Ti_xO_5$ dielectric layer, which is used as a gate oxide layer, which covers the nitride region;

forming a barrier layer on the $Ta_{2-x}Ti_xO_5$ dielectric layer;

forming a conducting layer on the barrier layer;

forming an anti-reflection layer on the conducting layer;

patterning the anti-reflection layer, the conducting layer, the barrier layer, and the $Ta_{2-x}Ti_xO_5$ dielectric layer, so that a gate structure is formed on the substrate of the nitride region;

forming a spacer on a sidewall of the gate strucure; and forming a source/drain (S/D) region in the substrate exposed by the gate structure and the spacer.

11. The fabrication method of claim 10, wherein the Ta-based organic compound includes a Tantalum-alkoxide compound.

12. The fabrication method of claim 10, wherein the Ta-based organic compound is selected from a group consisting of Tantalum penta-ethoxide ($Ta(C_2H_5O)_5$), Tantalum tetraethoxy dimethylaminoethoxide ($Ta(C_2H_5O)_4$ ($C_4H_{10}NO$)), Tantalum tetraethoxy tetramethylheptanedionate ($Ta(C_2H_5O)_4(C_{11}H_{19}O_2)$), Tantalum tetramethoxy tetramethylheptanedionate ($Ta(CH_3O)_4(C_{11}H_{19}O_2)$), Tantalum tetra-i-propoxy tetramethylheptanedionate ($Ta(C_3H_7O)_4$ ($C_{11}H_{19}O_2$)), and Tantalum tris-diethylamido-t-butylimide (($C_4H_{10}N)_3Ta(NC_4H_9)$).

13. The fabrication method of claim 10, wherein the Ti-based organic compound includes a Titanium-alkoxide compound.

14. The fabrication method of claim 13, wherein the Ti-based organic compound is selected from a group consisting of Titanium tetra-i-propoxide ($Ti(C_3H_7O)_4$), Titanium di-i-propoxide ($Ti(C_3H_7O)_2$), Titanium di-i-propoxy bidimehtylaminoethoxide ($Ti(C_3H_7O)_2(C_4H_{10}NO)_2$), Titanium diethoxy bidimehtylaminoethoxide ($Ti(C_2H_5O)_2$ ($C_4H_{10}NO)_2$), and Titanium tetrakis-t-butoxide ($Ti(C_4H_9O)_4$).

15. The fabrication method of claim 10, wherein the Ti-based organic compound includes a Titanium amino compound.

16. The fabrication method of claim 15, wherein the Ti-based organic compound is selected from a group consisting of Titanium tetrakis-diethylamide ($Ti(C_4H_{10}N)_4$) and Titanium tetrakis-dimethylamide ($Ti(C_2H_6N)_4$).

17. The fabrication method of claim 10, wherein the temperature involved in the OMCVD is about 380–500° C.

18. The fabrication method of claim 10, wherein the $Ta_{2-x}Ti_xO_5$ dielectric layer has a Ti content of about 4–15% of the molar percentage based on the total content of Ta and Ti therein.

19. The fabrication method of claim 10, further comprising forming a lightly doped drain (LDD) region in the substrate exposed by the gate structure before the step for forming the spacer.

20. The fabrication method of claim 10, further comprising forming a self-aligned silicide on the substrate exposed by the gate structure and the spacer after the step for forming the S/D region.

21. The fabrication method of claim 1, wherein the nitridation process comprises a rapid thermal process.

22. The fabrication method of claim 1, wherein the nitridation process is performed at about 800° C. to about 900° C.

23. The fabrication method of claim 1, wherein the nitridation process is performed for about 30 seconds to about 60 seconds.

24. The fabrication method of claim 10, wherein the nitridation process comprises a rapid thermal process.

25. The fabrication method of claim 10, wherein the nitridation process is performed at about 800° C. to about 900° C.

26. The fabrication method of claim 10, wherein the nitridation process is performed for about 30 seconds to about 60 seconds.

27. A method for fabricating a gate structure, the method comprising:

providing a substrate;

performing a nitridation process to nitridate a portion of the substrate to form a nitride region;

performing an organic metal chemical vapor deposition (OMCVD) at a temperature between about 380° and 500° C., with a Tantalum (Ta)-based organic compound and a Titanium (Ti)-based organic compound serving as precursors, to form a $Ta_{2-x}Ti_xO_5$ dielectric layer, which covers the nitride region, wherein the $Ta_{2-x}Ti_xO_5$ dielectric layer has a Ti content of about 4%–15% of the molar percentage based on the total content of Ta and Ti therein;

forming a barrier layer on the $Ta_{2-x}Ti_xO_5$ dielectric layer;

forming a conducting layer on the barrier layer;

forming an anti-reflection layer on the conducting layer; and patterning the anti-reflection layer, the conducting layer, the barrier layer, and the $Ta_{2-x}Ti_xO_5$ dielectric layer, so that a gate structure is formed on the nitride region.

\* \* \* \* \*